(12) United States Patent
Shimizu et al.

(10) Patent No.: US 10,854,794 B2
(45) Date of Patent: Dec. 1, 2020

(54) MONOLITHIC LED ARRAY STRUCTURE

(71) Applicant: Lumileds LLC, San Jose, CA (US)

(72) Inventors: Kentaro Shimizu, Sunnyvale, CA (US); Hisashi Masui, California, CA (US); Yu-Chen Shen, Sunnyvale, CA (US); Danielle Russell Chamberlin, Belmont, CA (US); Peter Josef Schmidt, Aachen (DE)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 16/226,607

(22) Filed: Dec. 19, 2018

(65) Prior Publication Data

US 2019/0189865 A1    Jun. 20, 2019

Related U.S. Application Data

(60) Provisional application No. 62/608,521, filed on Dec. 20, 2017.

(30) Foreign Application Priority Data

Feb. 28, 2018 (EP) .................................... 18159224

(51) Int. Cl.
*H01L 33/50* (2010.01)
*H01L 33/46* (2010.01)
(Continued)

(52) U.S. Cl.
CPC .............. *H01L 33/505* (2013.01); *G09G 3/32* (2013.01); *H01L 25/0753* (2013.01);
(Continued)

(58) Field of Classification Search
CPC ..... H01L 33/505; H01L 33/005; H01L 33/32; H01L 33/382; H01L 33/46; H01L 33/50;
(Continued)

(56) References Cited

U.S. PATENT DOCUMENTS 9,624,124 B2    4/2017  Aitken et al.
10,368,417 B2   7/2019  Kim et al.
(Continued)

FOREIGN PATENT DOCUMENTS

EP    2610058    7/2013
EP    3012878    4/2016
(Continued)

OTHER PUBLICATIONS

Notice of Allowance corresponding to U.S. Appl. No. 16/358,085, dated May 3, 2020, 9 pages.
(Continued)

*Primary Examiner* — Timor Karimy

(57) ABSTRACT

A wavelength converting layer is partially diced to generate a first and second wavelength converting layer segment and to allow partial isolation between the first segment and the second segment such that the wavelength converting layer segments are connected by a connecting wavelength converting layer. The first and second wavelength converting layer segments are attached to a first and second light emitting device, respectively to create a first and second pixel. The connecting wavelength converting layer segment is removed to allow complete isolation between the first pixel and the second pixel. An optical isolation material is applied to exposed surfaces of the first and second pixel and a sacrificial portion of the wavelength converting layer segments and optical isolation material attached to the sacrificial portion is removed from a surface facing away from the first light emitting device, to expose a emitting surface of the first wavelength converting layer segment.

10 Claims, 12 Drawing Sheets

(51) Int. Cl.
| | |
|---|---|
| *H01L 33/32* | (2010.01) |
| *H01L 27/15* | (2006.01) |
| *H01L 33/38* | (2010.01) |
| *H01L 25/075* | (2006.01) |
| *G09G 3/32* | (2016.01) |
| *H01L 33/00* | (2010.01) |
| *H01L 33/60* | (2010.01) |
| *H01L 33/62* | (2010.01) |

(52) U.S. Cl.
CPC .......... *H01L 27/156* (2013.01); *H01L 33/005* (2013.01); *H01L 33/32* (2013.01); *H01L 33/382* (2013.01); *H01L 33/46* (2013.01); *H01L 33/50* (2013.01); *H01L 33/60* (2013.01); *H01L 33/62* (2013.01); *H01L 2933/0016* (2013.01); *H01L 2933/0025* (2013.01); *H01L 2933/0033* (2013.01); *H01L 2933/0041* (2013.01); *H01L 2933/0091* (2013.01)

(58) Field of Classification Search
CPC ..... H01L 33/60; H01L 33/62; H01L 25/0753; H01L 27/156; H01L 2933/0016; H01L 2933/0025; H01L 2933/0033; H01L 2933/0041; H01L 2933/0091; G09G 3/32
See application file for complete search history.

(56) References Cited

U.S. PATENT DOCUMENTS

| | | |
|---|---|---|
| 2011/0266569 A1 | 11/2011 | Basin et al. |
| 2012/0052608 A1 | 3/2012 | Yoo et al. |
| 2013/0149508 A1 | 6/2013 | Kwak et al. |
| 2013/0258636 A1 | 10/2013 | Rettke |
| 2014/0339582 A1 | 11/2014 | Matsumura et al. |
| 2015/0171287 A1 | 6/2015 | Matsumura et al. |
| 2015/0311405 A1 | 10/2015 | Oyamada et al. |
| 2016/0351620 A1 | 12/2016 | Tanaka |
| 2017/0133562 A1 | 5/2017 | Ling et al. |
| 2017/0170360 A1 | 6/2017 | Bour et al. |
| 2017/0207249 A1 | 7/2017 | Rhee |
| 2017/0248280 A1 | 8/2017 | Ichikawa |
| 2018/0151543 A1 | 5/2018 | Lee |
| 2018/0192495 A1 | 7/2018 | Kim et al. |
| 2019/0157523 A1 | 5/2019 | Hong |
| 2019/0189865 A1 | 6/2019 | Shimzu et al. |
| 2019/0324350 A1 | 10/2019 | Van Der Sijde et al. |

FOREIGN PATENT DOCUMENTS

| | | |
|---|---|---|
| GB | 2554226 A | 3/2018 |
| TW | 201021087 A | 6/2010 |
| TW | 201143165 A | 12/2011 |
| WO | 2013/175338 | 11/2013 |
| WO | 2014/072865 A1 | 5/2014 |
| WO | 2015/135839 A1 | 9/2015 |
| WO | 2019/126582 A1 | 6/2019 |

OTHER PUBLICATIONS

Corrected Notice of Allowability corresponding to U.S. Appl. No. 16/358,085, dated May 28, 2020, 5 pages.
European Search Report corresponding to EP18159224, dated Aug. 2, 2018, 4 pages.
Partial European Search Report corresponding to EP18159224, dated Aug. 2, 2018, 4 pages.
International Search Report where the EPO was the ISA for PCT/US2018/066950, dated Feb. 27, 2019, 4 pages.
Written Opinion of the International Searching Authority for PCT/US2018/066950, dated Feb. 27, 2019, 9 pages.
International Search Report where the EPO was the ISA for PCT/IB2019/001395, dated May 28, 2020, 4 pages.
Written Opinion of the International Searching Authority for PCT/IB2019/001395, dated May 28, 2020, 7 pages.

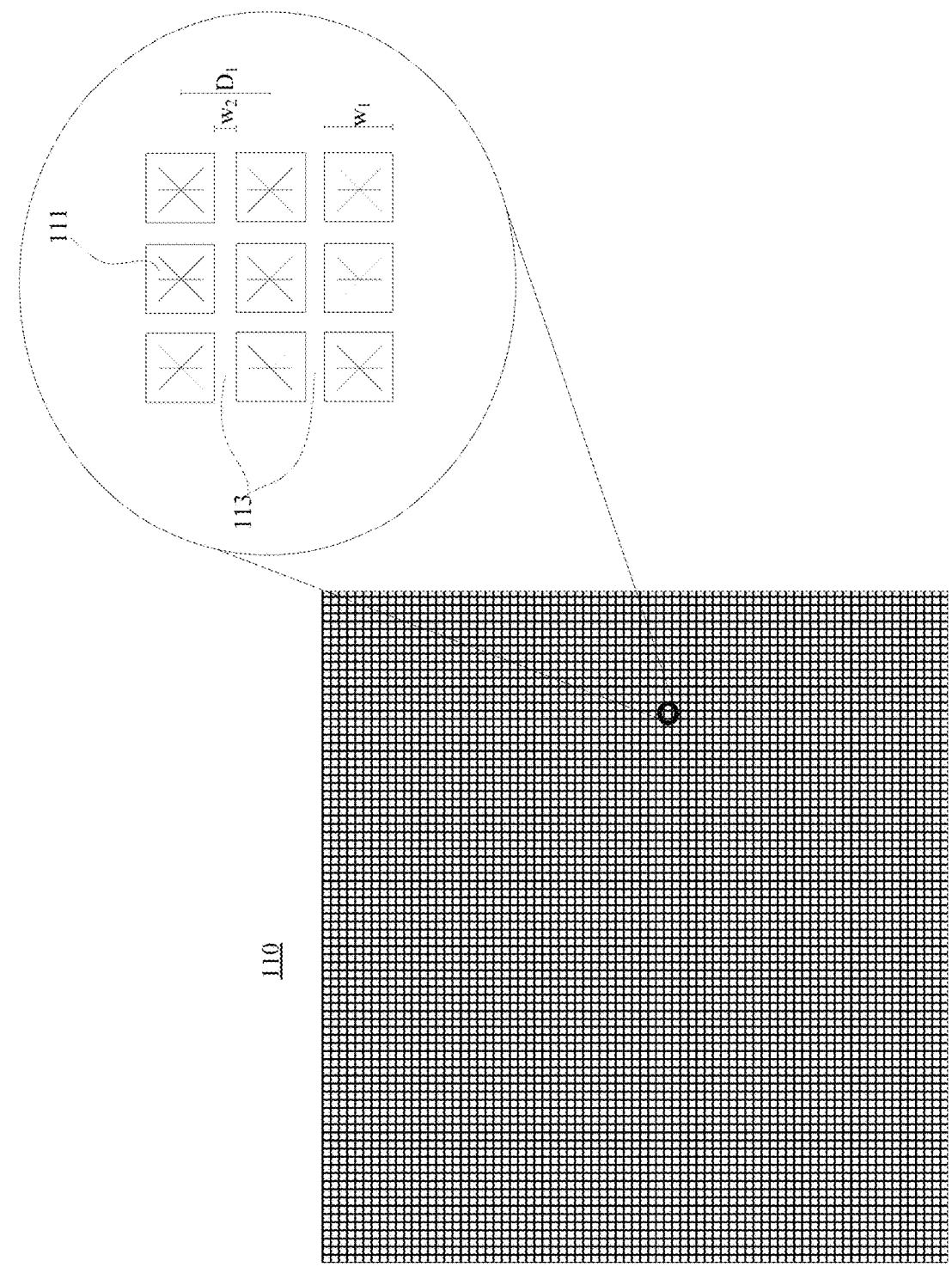

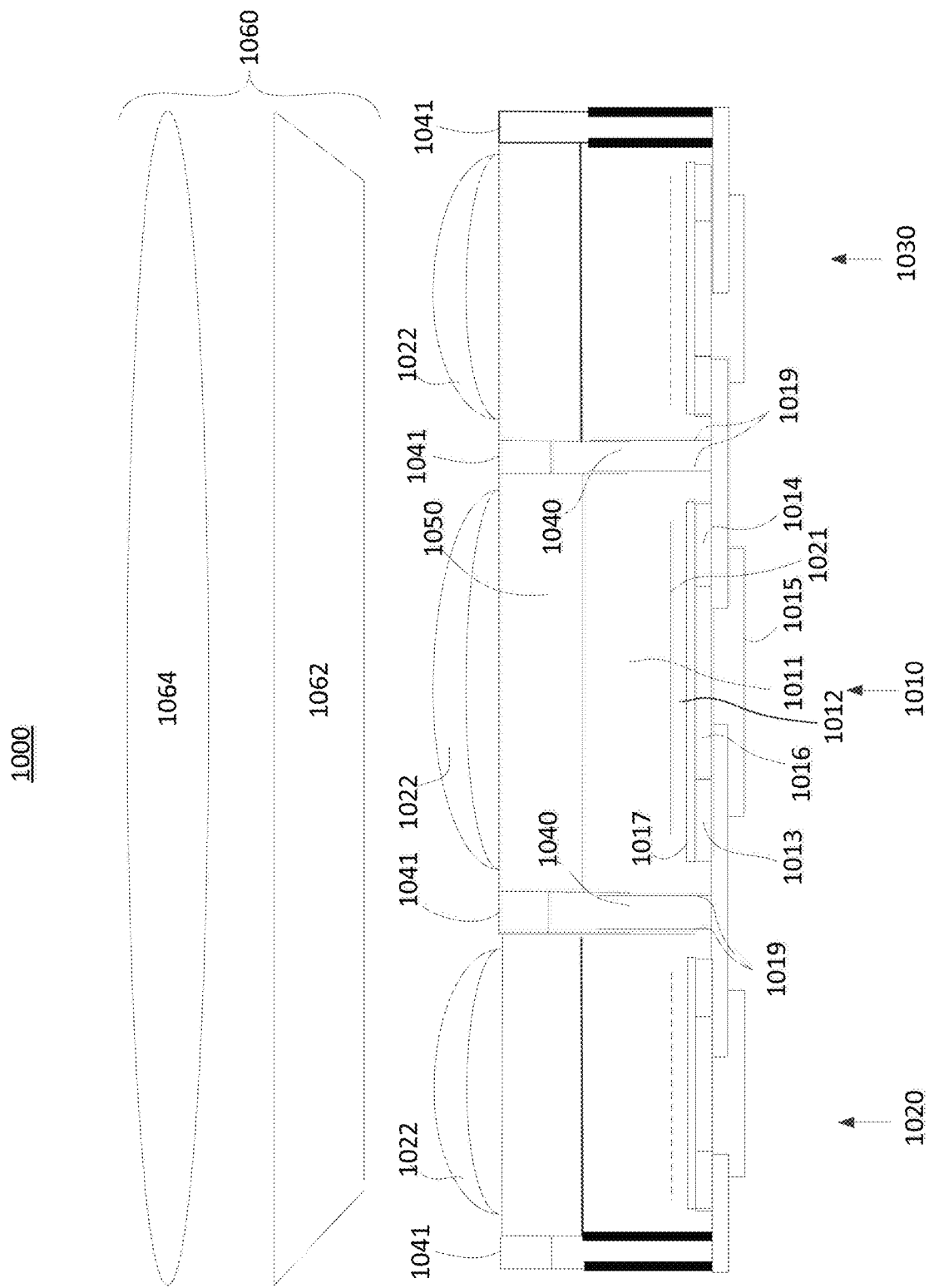

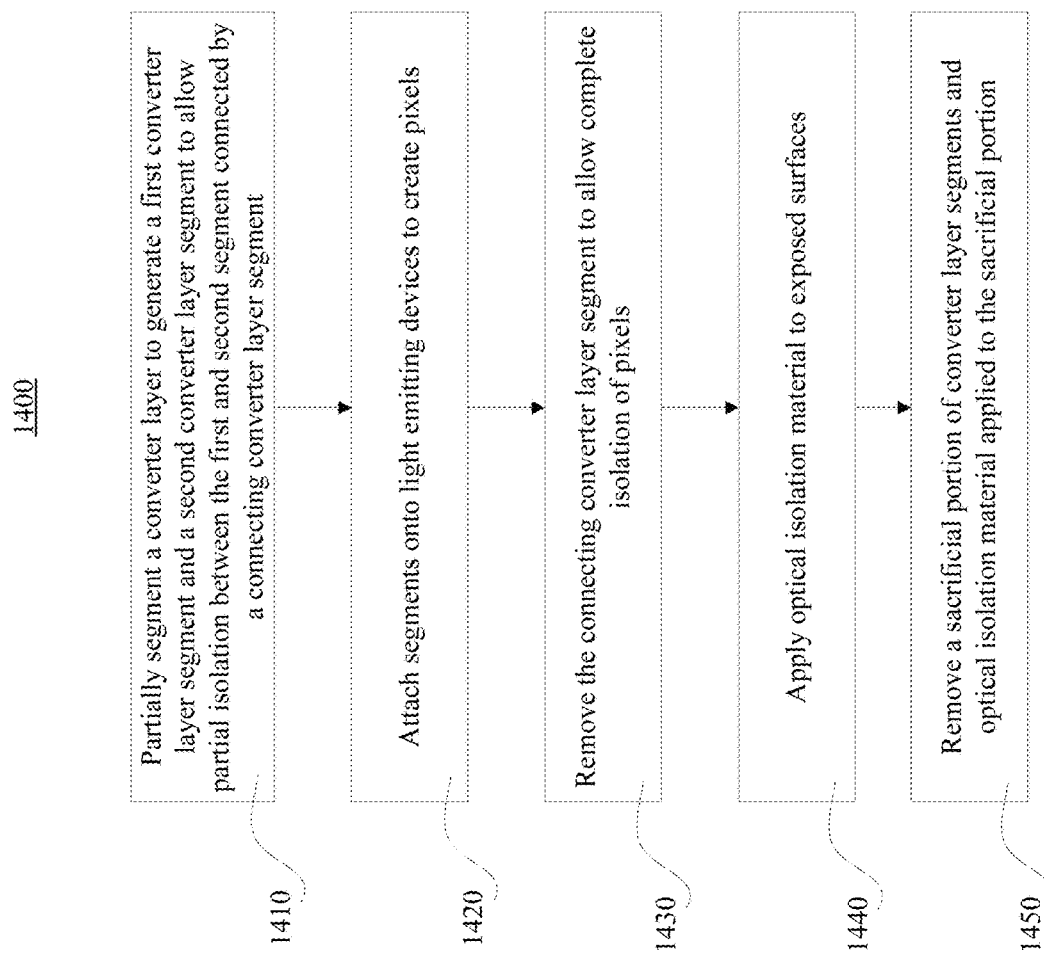

MONOLITHIC LED ARRAY STRUCTURE

BACKGROUND

Precision control lighting applications can require the production and manufacturing of small addressable light emitting diode (LED) pixel systems. Manufacturing such LED pixel systems can require accurate deposition of material due to the small size of the pixels and the small lane space between the systems. Semiconductor light-emitting devices including LEDs, resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, composite, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

III-nitride devices are often formed as inverted or flip chip devices, where both the n- and p-contacts formed on the same side of the semiconductor structure, and most of the light is extracted from the side of the semiconductor structure opposite the contacts.

SUMMARY

A wavelength converting layer is partially diced to generate a first and second wavelength converting layer segment and to allow partial isolation between the first segment and the second segment such that the wavelength converting layer segments are connected by a connecting wavelength converting layer. The first and second wavelength converting layer segments are attached to a first and second light emitting device, respectively to create a first and second pixel. The connecting wavelength converting layer segment is removed to allow complete isolation between the first pixel and the second pixel. An optical isolation material is applied to exposed surfaces of the first and second pixel and a sacrificial portion of the wavelength converting layer segments and optical isolation material attached to the sacrificial portion is removed from a surface facing away from the first light emitting device, to expose a emitting surface of the first wavelength converting layer segment.

BRIEF DESCRIPTION OF THE DRAWINGS

A more detailed understanding may be had from the following description, given by way of example in conjunction with the accompanying drawings wherein:

FIG. 1A is a top view illustration of an LED array with an exploded portion;

FIG. 1B is a cross sectional illustration of an LED array with trenches;

FIG. 1F is another flowchart of a process to generate pixels in an LED array;

DETAILED DESCRIPTION

Figure 1C:
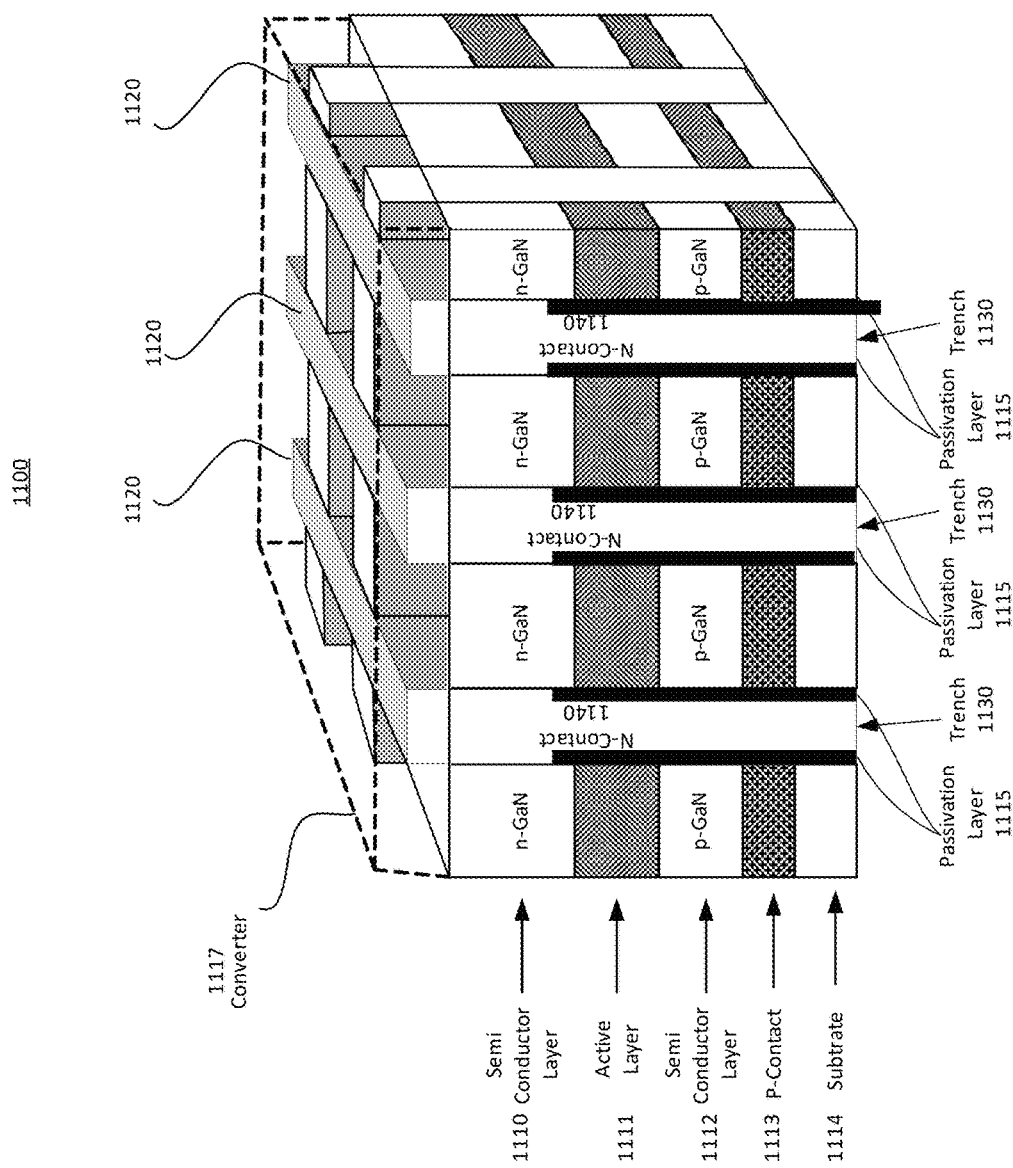
FIG. 1C is a perspective illustration of another LED array with trenches.

Examples of different light illumination systems and/or light emitting diode ("LED") implementations will be described more fully hereinafter with reference to the accompanying drawings. These examples are not mutually exclusive, and features found in one example may be combined with features found in one or more other examples to achieve additional implementations. Accordingly, it will be understood that the examples shown in the accompanying drawings are provided for illustrative purposes only and they are not intended to limit the disclosure in any way. Like numbers refer to like elements throughout.

It will be understood that, although the terms first, second, third, etc. may be used herein to describe various elements, these elements should not be limited by these terms. These terms may be used to distinguish one element from another. For example, a first element may be termed a second element and a second element may be termed a first element without departing from the scope of the present invention. As used herein, the term "and/or" may include any and all combinations of one or more of the associated listed items.

It will be understood that when an element such as a layer, region, or substrate is referred to as being "on" or extending "onto" another element, it may be directly on or extend directly onto the other element or intervening elements may also be present. In contrast, when an element is referred to as being "directly on" or extending "directly onto" another element, there may be no intervening elements present. It will also be understood that when an element is referred to as being "connected" or "coupled" to another element, it may be directly connected or coupled to the other element and/or connected or coupled to the other element via one or more intervening elements. In contrast, when an element is referred to as being "directly connected" or "directly coupled" to another element, there are no intervening elements present between the element and the other element. It will be understood that these terms are intended to encompass different orientations of the element in addition to any orientation depicted in the figures.

Relative terms such as "below," "above," "upper,", "lower," "horizontal" or "vertical" may be used herein to describe a relationship of one element, layer, or region to another element, layer, or region as illustrated in the figures. It will be understood that these terms are intended to encompass different orientations of the device in addition to the orientation depicted in the figures.

Semiconductor light emitting devices (LEDs) or optical power emitting devices, such as devices that emit ultraviolet (UV) or infrared (IR) optical power, are among the most efficient light sources currently available. These devices (hereinafter "LEDs"), may include light emitting diodes, resonant cavity light emitting diodes, vertical cavity laser diodes, edge emitting lasers, or the like. Due to their compact size and lower power requirements, for example, LEDs may be attractive candidates for many different applications. For example, they may be used as light sources (e.g., flash lights and camera flashes) for hand-held battery-powered devices, such as cameras and cell phones. They may also be used, for example, for automotive lighting, heads up display (HUD) lighting, horticultural lighting, street lighting, torch for video, general illumination (e.g., home, shop, office and studio lighting, theater/stage lighting and architectural lighting), augmented reality (AR) lighting, virtual reality (VR) lighting, as back lights for displays, and IR spectroscopy. A single LED may provide light that is less bright than an incandescent light source, and, therefore, multi-junction devices or arrays of LEDs (such as monolithic LED arrays, micro LED arrays, etc.) may be used for applications where more brightness is desired or required.

According to embodiments of the disclosed subject matter, LED arrays (e.g., micro LED arrays) may include an array of pixels as shown in FIGS. 1A, 1B, and/or 1C. LED arrays may be used for any applications such as those requiring precision control of LED array segments. Pixels in an LED array may be individually addressable, may be addressable in groups/subsets, or may not be addressable. In FIG. 1A, a top view of a LED array 110 with pixels 111 is shown. An exploded view of a 3×3 portion of the LED array 110 is also shown in FIG. 1A. As shown in the 3×3 portion exploded view, LED array 110 may include pixels 111 with a width $w_1$ of approximately 100 μm or less (e.g., 40 μm). The lanes 113 between the pixels may be separated by a width, $w_2$, of approximately 20 μm or less (e.g., 5 μm). The lanes 113 may provide an air gap between pixels or may contain other material, as shown in FIGS. 1B and 1C and further disclosed herein. The distance $d_1$ from the center of one pixel 111 to the center of an adjacent pixel 111 may be approximately 120 μm or less (e.g., 45 μm). It will be understood that the widths and distances provided herein are examples only, and that actual widths and/or dimensions may vary.

It will be understood that although rectangular pixels arranged in a symmetric matrix are shown in FIGS. 1A, B and C, pixels of any shape and arrangement may be applied to the embodiments disclosed herein. For example, LED array 110 of FIG. 1A may include, over 10,000 pixels in any applicable arrangement such as a 100×100 matrix, a 200×50 matrix, a symmetric matrix, a non-symmetric matrix, or the like. It will also be understood that multiple sets of pixels, matrixes, and/or boards may be arranged in any applicable format to implement the embodiments disclosed herein.

FIG. 1B shows a cross section view of an example LED array 1000. As shown, the pixels 1010, 1020, and 1030 correspond to three different pixels within an LED array such that a separation sections 1041 and/or n-type contacts 1040 separate the pixels from each other. According to an embodiment, the space between pixels may be occupied by an air gap. As shown, pixel 1010 includes an epitaxial layer 1011 which may be grown on any applicable substrate such as, for example, a sapphire substrate, which may be removed from the epitaxial layer 1011. A surface of the growth layer distal from contact 1015 may be substantially planar or may be patterned. A p-type region 1012 may be located in proximity to a p-contact 1017. An active region 1021 may be disposed adjacent to the n-type region and a p-type region 1012. Alternatively, the active region 1021 may be between a semiconductor layer or n-type region and p-type region 1012 and may receive a current such that the active region 1021 emits light beams. The p-contact 1017 may be in contact with SiO2 layers 1013 and 1014 as well as plated metal (e.g., plated copper) layer 1016. The n type contacts 1040 may include an applicable metal such as Cu. The metal layer 1016 may be in contact with a contact 1015 which may be reflective.

Notably, as shown in FIG. 1B, the n-type contact 1040 may be deposited into trenches 1130 created between pixels 1010, 1020, and 1030 and may extend beyond the epitaxial layer. Separation sections 1041 may separate all (as shown) or part of a converter material 1050. It will be understood that a LED array may be implemented without such separation sections 1041 or the separation sections 1041 may correspond to an air gap. The separation sections 1041 may be an extension of the n-type contacts 1040, such that, separation sections 1041 are formed from the same material as the n-type contacts 1040 (e.g., copper). Alternatively, the separation sections 1041 may be formed from a material different than the n-type contacts 1040. According to an embodiment, separation sections 1041 may include reflective material. The material in separation sections 1041 and/or the n-type contact 1040 may be deposited in any applicable manner such as, for example, but applying a mesh structure which includes or allows the deposition of the n-type contact 1040 and/or separation sections 1041. Converter material 1050 may have features/properties similar to wavelength converting layer 205 of FIG. 2A. As noted herein, one or more additional layers may coat the separation sections 1041. Such a layer may be a reflective layer, a scattering layer, an absorptive layer, or any other applicable layer. One or more passivation layers 1019 may fully or partially separate the n-contact 1040 from the epitaxial layer 1011.

The epitaxial layer 1011 may be formed from any applicable material to emit photons when excited including sapphire, SiC, GaN, Silicone and may more specifically be formed from a III-V semiconductors including, but not limited to, AlN, AlP, AlAs, AlSb, GaN, GaP, GaAs, GaSb, InN, InP, InAs, InSb, II-VI semiconductors including, but not limited to, ZnS, ZnSe, CdSe, CdTe, group IV semiconductors including, but not limited to Ge, Si, SiC, and mixtures or alloys thereof. These example semiconductors may have indices of refraction ranging from about 2.4 to about 4.1 at the typical emission wavelengths of LEDs in which they are present. For example, III-Nitride semiconductors, such as GaN, may have refractive indices of about 2.4 at 500 nm, and III-Phosphide semiconductors, such as InGaP, may have refractive indices of about 3.7 at 600 nm. Contacts coupled to the LED device 200 may be formed from a solder, such as AuSn, AuGa, AuSi or SAC solders.

The n-type region may be grown on a growth substrate and may include one or more layers of semiconductor material that include different compositions and dopant concentrations including, for example, preparation layers, such as buffer or nucleation layers, and/or layers designed to facilitate removal of the growth substrate. These layers may be n-type or not intentionally doped, or may even be p-type device layers. The layers may be designed for particular optical, material, or electrical properties desirable for the light emitting region to efficiently emit light. Similarly, the p-type region 1012 may include multiple layers of different composition, thickness, and dopant concentrations, including layers that are not intentionally doped, or n-type layers. An electrical current may be caused to flow through the p-n junction (e.g., via contacts) and the pixels may generate light of a first wavelength determined at least in part by the bandgap energy of the materials. A pixel may directly emit light (e.g., regular or direct emission LED) or may emit light into a wavelength converting layer 1050 (e.g., phosphor converted LED, "POLED", etc.) that acts to further modify wavelength of the emitted light to output a light of a second wavelength.

Although FIG. 1B shows an example LED array 1000 with pixels 1010, 1020, and 1030 in an example arrangement, it will be understood that pixels in an LED array may be provided in any one of a number of arrangements. For example, the pixels may be in a flip chip structure, a vertical injection thin film (VTF) structure, a multi-junction structure, a thin film flip chip (TFFC), lateral devices, etc. For example, a lateral LED pixel may be similar to a flip chip LED pixel but may not be flipped upside down for direct connection of the electrodes to a substrate or package. A TFFC may also be similar to a flip chip LED pixel but may have the growth substrate removed (leaving the thin film semiconductor layers un-supported). In contrast, the growth substrate or other substrate may be included as part of a flip chip LED.

The wavelength converting layer 1050 may be in the path of light emitted by active region 1021, such that the light emitted by active region 1021 may traverse through one or more intermediate layers (e.g., a photonic layer). According to embodiments, wavelength converting layer 1050 or may not be present in LED array 1000. The wavelength converting layer 1050 may include any luminescent material, such as, for example, phosphor particles in a transparent or translucent binder or matrix, or a ceramic phosphor element, which absorbs light of one wavelength and emits light of a different wavelength. The thickness of a wavelength converting layer 1050 may be determined based on the material used or application/wavelength for which the LED array 1000 or individual pixels 1010, 1020, and 1030 is/are arranged. For example, a wavelength converting layer 1050 may be approximately 20 µm, 50 µm or 200 µm. The wavelength converting layer 1050 may be provided on each individual pixel, as shown, or may be placed over an entire LED array 1000.

Primary optic 1022 may be on or over one or more pixels 1010, 1020, and/or 1030 and may allow light to pass from the active region 101 and/or the wavelength converting layer 1050 through the primary optic. Light via the primary optic may generally be emitted based on a Lambertian distribution pattern such that the luminous intensity of the light emitted via the primary optic 1022, when observed from an ideal diffuse radiator, is directly proportional to the cosine of the angle between the direction of the incident light and the surface normal. It will be understood that one or more properties of the primary optic 1022 may be modified to produce a light distribution pattern that is different than the Lambertian distribution pattern.

Secondary optics which include one or both of the lens 1065 and waveguide 1062 may be provided with pixels 1010, 1020, and/or 1030. It will be understood that although secondary optics are discussed in accordance with the example shown in FIG. 1B with multiple pixels, secondary optics may be provided for single pixels. Secondary optics may be used to spread the incoming light (diverging optics), or to gather incoming light into a collimated beam (collimating optics). The waveguide 1062 may be coated with a dielectric material, a metallization layer, or the like and may be provided to reflect or redirect incident light. In alternative embodiments, a lighting system may not include one or more of the following: the wavelength converting layer 1050, the primary optics 1022, the waveguide 1062 and the lens 1065.

Lens 1065 may be formed form any applicable transparent material such as, but not limited to SiC, aluminum oxide, diamond, or the like or a combination thereof. Lens 1065 may be used to modify the a beam of light to be input into the lens 1065 such that an output beam from the lens 1065 will efficiently meet a desired photometric specification. Additionally, lens 1065 may serve one or more aesthetic purpose, such as by determining a lit and/or unlit appearance of the multiple LED devices 200B.

FIG. 1C shows a cross section of a three dimensional view of a LED array 1100. As shown, pixels in the LED array 1100 may be separated by trenches which are filled to form n-contacts 1140. The pixels may be grown on a substrate 1114 and may include a p-contact 1113, a p-GaN semiconductor layer 1112, an active region 1111, and an n-Gan semiconductor layer 1110. It will be understood that this structure is provided as an example only and one or more semiconductor or other applicable layers may be added, removed, or partially added or removed to implement the disclosure provided herein. A converter material 1117 may be deposited on the semiconductor layer 1110 (or other applicable layer).

Passivation layers 1115 may be formed within the trenches 1130 and n-contacts 1140 (e.g., copper contacts) may be deposited within the trenches 1130, as shown. The passivation layers 1115 may separate at least a portion of the n-contacts 1140 from one or more layers of the semiconductor. According to an implementation, the n-contacts 1140, or other applicable material, within the trenches may extend into the converter material 1117 such that the n-contacts 1140, or other applicable material, provide complete or partial optical isolation between the pixels.

Techniques disclosed herein include dicing and/or wafer level segmentation which may include generating or providing a grown or otherwise manufacturing LED components such as, but not limited to, a semiconductor layer, n-type material, p-type material, converter material, die, carrier material, or the like or a combination thereof. The component may be cured or may be treated with a temperature based treatment, chemical treatment, or other treatment. The component may be diced such that two or more segments of the component result from the dicing process. The segments may be completely isolated or may be partially isolated from each other. The segments may include a substantially uniform material or may include multiple materials. The segments may undergo additional treatments/process and may be cleaned through a, for example, chemical, ultrasonic, or other applicable cleaning process.

The subject matter disclosed herein may be applied to generating arrays with sub-500 micron pixels and sub-100 micron components. Pixels in LED arrays with sidewalls covered by optical isolation materials may be generated using the techniques disclosed herein.

As used herein, dice, dicing, or diced may correspond to or refer to any applicable manner of segmenting, dividing, apportioning, slicing, compartmentalizing, or the like, or by dicing as understood in the art. A component may be diced by any applicable manner such as sawing, etching, applying a mask to dice, using one or more lasers, chemical treatment, or the like.

Figure 1D:
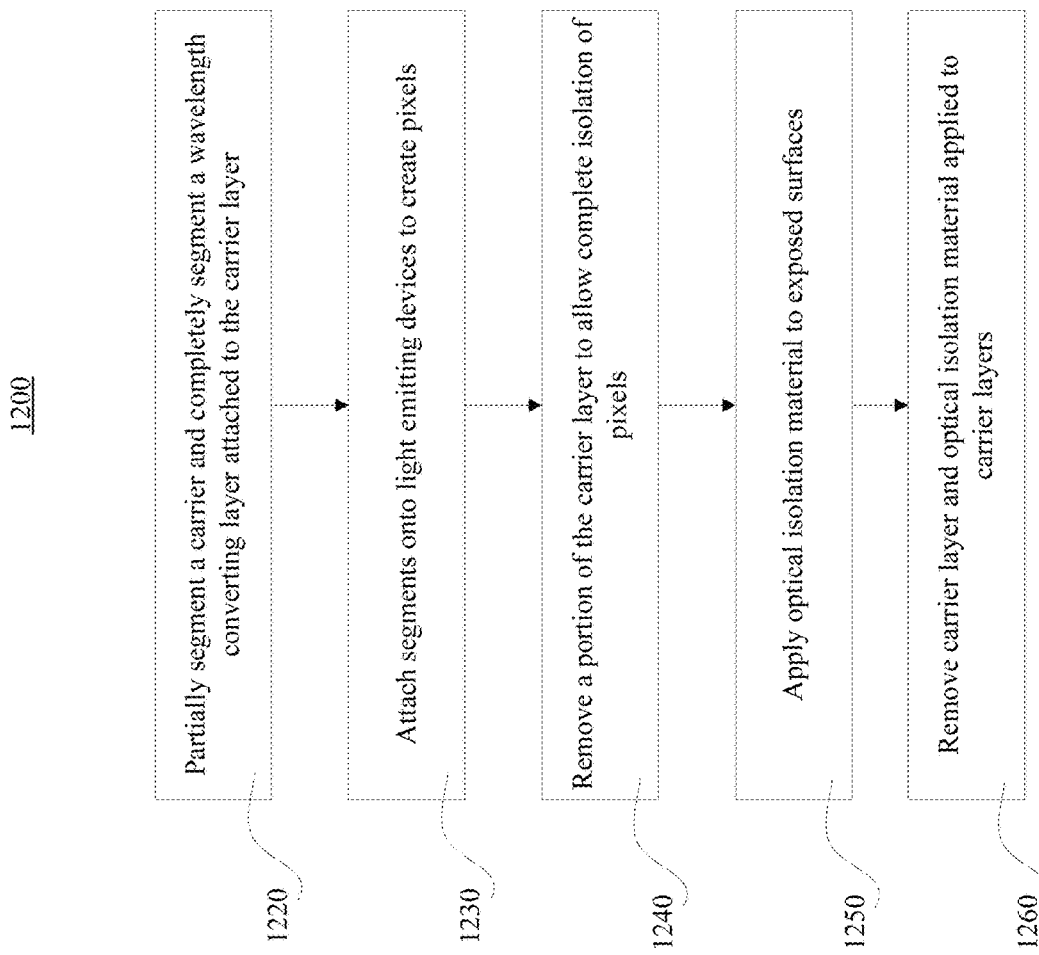
FIG. 1D is a flow diagram for generating pixels in a LED array.

FIG. 1D shows a method 1200 for generating pixels in an LED array, according to the subject matter disclosed herein.

The pixels in such a LED array may be sub-500 micron large such as, for example, having a width of approximately 100 microns. A wavelength converting layer may be attached to a carrier layer and, at step 1220, the two attached layers may be diced such that they are divided into multiple segments separated by gaps between the segments. The wavelength converting layer may be removed from the space between the segments such that there is no wavelength converting layer in the gaps. Part of the carrier layer may be removed within each gap area and part of the carrier layer may remain in a contiguous manner such that the segments are connected by the contiguous parts of the carrier layer that are not removed during the segmentation. At step 1230, the segments may be aligned with light emitting devices and attached to the light emitting devices to create pixels. At step 1240, the portion of the carrier layer connecting two or more segments may be removed such that the segments are no longer connected via the carrier layer. At step 1250, an optical isolation material may be applied to the exposed surfaces of the pixels. At step 1260, the carrier layer and any corresponding optical isolation material that is attached to the surface of the carrier layer may be removed, resulting in a pixel that includes the light emitting device and wavelength converting layer along with the optical isolation material on the sidewalls of the light-emitting device and wavelength converting layer.

A wavelength converting layer may contain material configured to convert one or more properties of light, as disclosed herein. The wavelength converting layer may convert a property of light, such as, but not limited to, its wavelength, its phase, or the like.

A carrier layer may contain, but is not limited to, any material that has a coefficient of thermal expansion (CTE) that is substantially matched to the CTE of the wavelength converting layer. Additionally, a carrier layer may contain material that is able to undergo the temperature requirements of an atomic layer deposition (ALD) process. The softening temperature of the carrier layer may be higher than the softening temperature of the wavelength converting layer. As non-limiting examples, the carrier layer may be an alumosilicate glass and may have a CTE of 8.7 ppm/K with a softening temperature of 827° C. or, alternatively, the carrier layer may a glass and have a CTE of 9.4 ppm/K with a softening temperature of 724° C. The carrier layer may be a glass layer, a ceramic layer, or the like.

An optical isolation material may be any applicable optically modifying material such as a distributed Bragg reflector (DBR) layer(s), reflective material, absorptive material, or the like. As specific examples, the optical isolation material may include stainless steel or aluminum. DBR layers may include, but are not limited to, layers of $SiO_2$ and $TiO_2$; $SiO_2$ and $ZrO_2$; SiC and MgO; SiC and Silica; GaAs and AlAs; ITO, or the like.

Figure 1E:
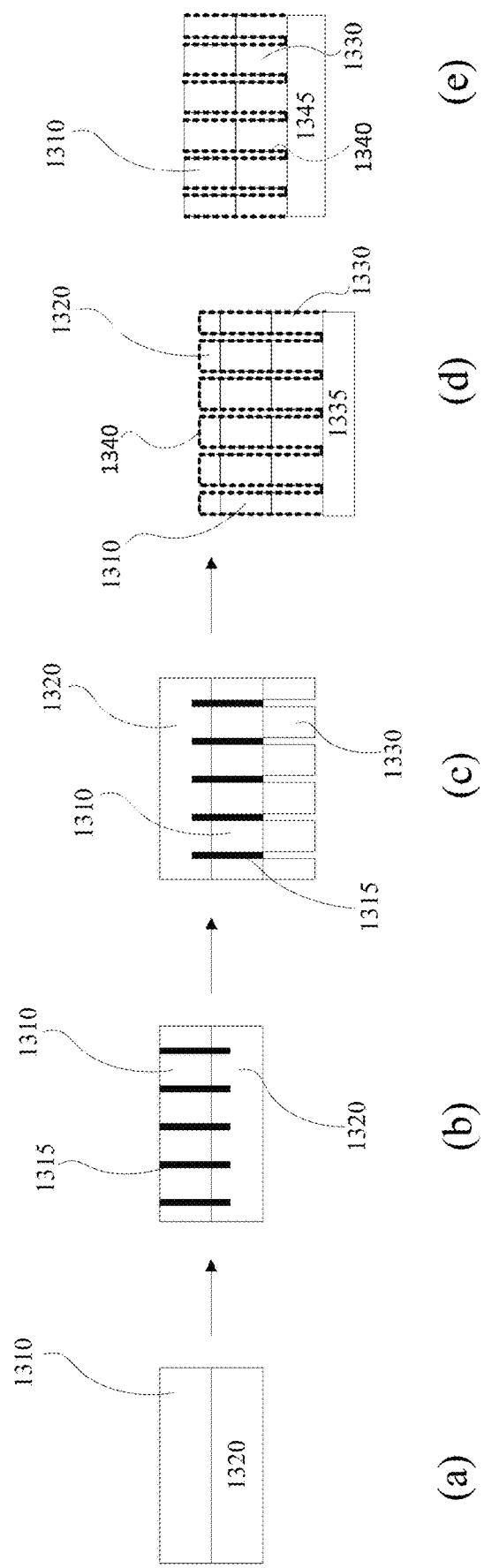
FIG. 1E is a cross-section view diagram of generating pixels in an LED array.

As shown in FIG. 1E at (a), a carrier layer 1320 may be attached to a wavelength converting layer 1310. The carrier layer 1320 may be attached to wavelength converting layer 1310 via any applicable technique including attachment via an adhesive material.

According to step 1220 of FIG. 1D, as shown in FIG. 1E at (b), the carrier layer 1320 attached to wavelength converting layer 1310 may be diced to create gaps 1315 between the segments. As shown in FIG. 1E at (b), the gaps 1315 between the segments may not contain the wavelength converting layer 1310 and may extend into the carrier layer 320. To clarify, the wavelength converting layer 1310 of a first segment may be completely isolated by the wavelength converting layer 1310 of a second segment such that the gap is provided between the wavelength converting layer 1310 of the first segment and the wavelength converting layer 1310 of the second segment. A contiguous portion of the carrier layer 1320 may remain and may connect the segments.

According to step 1230 of FIG. 1D, as shown in FIG. 1E at (c), the segmented carrier layer 1320 and wavelength converting layer 1310 may be aligned with and attached to light emitting devices 1330. The gaps 1315 between the segmented layers may correspond to the required spacing between the light emitting devices 1330 such that the segmented layers can be aligned with and attached to the light emitting devices 1330. Light emitting device 1330 may contain an active light-emitting layer and may also contain n-contacts and p-contacts that enable current to activate the active light-emitting layer. The carrier layers 1320, wavelength converting layer 1310 and light emitting devices 1330 may be cured via any applicable technique such as temperature based curing, polymer based curing, UV based curing, or the like.

According to step 1240 of FIG. 1D, as shown in FIG. 1E at (d), a portion of the carrier layer 1320 may be removed such that at least the contiguous portion of the carrier layer 1320 that connected the segments is removed. The portion of carrier layer 1320 may be removed using any applicable technique including via sawing, etching, applying a mask to dice, using one or more lasers, chemical treatment, or the like, or by dicing as understood in the art. The dicing may result in individual pixels that contain light emitting devices 1330, wavelength converting layers, 1320, and a portion of the carrier layer 1320 such that the pixels are not connected via the carrier layer 1320.

As shown in FIG. 1E at (d), the light emitting devices 1330 with the segmented wavelength converting layer 1310 and carrier layer 1320 (collectively, pixels) may be placed on a tape 1335 which may be configured to restrict the leakage of gas particles. As an example, the tape 1335 may be a kapton tape. According to step 1250 of FIG. 1D, an optical isolation material 1340 may be applied to the pixels. The optical isolation material may be applied via an atomic layer deposition (ALD) process. ALD is a technique whereby a material may be deposited onto a surface in a self-limiting manner such that a thin coating or layer of the material is deposited into the surface. As shown in FIG. 1E at (d), an optical isolation material 1340 may be deposited onto the exposed surfaces of the pixels including the sidewalls of the light emitting devices 1330, the sidewalls of the wavelength converting layers 1310 and the sidewall and top surface of the carrier layers 1320.

As shown in FIG. 1E at (e) the pixels may be deposited onto a tape 1345 configured to support component removal techniques. According to an implementation, tape 1335 and 1345 may be the same tape. According to step 1260 of FIG. 1D, carrier layer 1320 as well as the optical isolation material 1340 on the top surface and sidewalls of the carrier layer 1320 may be removed. The removal may be conducted via sawing, etching, applying a mask to dice, using one or more lasers, chemical treatment, or the like, or dicing as understood in the art. The resulting pixel may contain light emitting devices 1330 with optical isolation material on their sidewalls and wavelength converting layers 1310 with optical isolation material on their sidewalls. As shown, the surface of the wavelength converting layers 1310 opposite the light emitting devices 1330 do not contain the optical isolation material and the pixels may be configured to emit light through this surface.

Figure 1G:
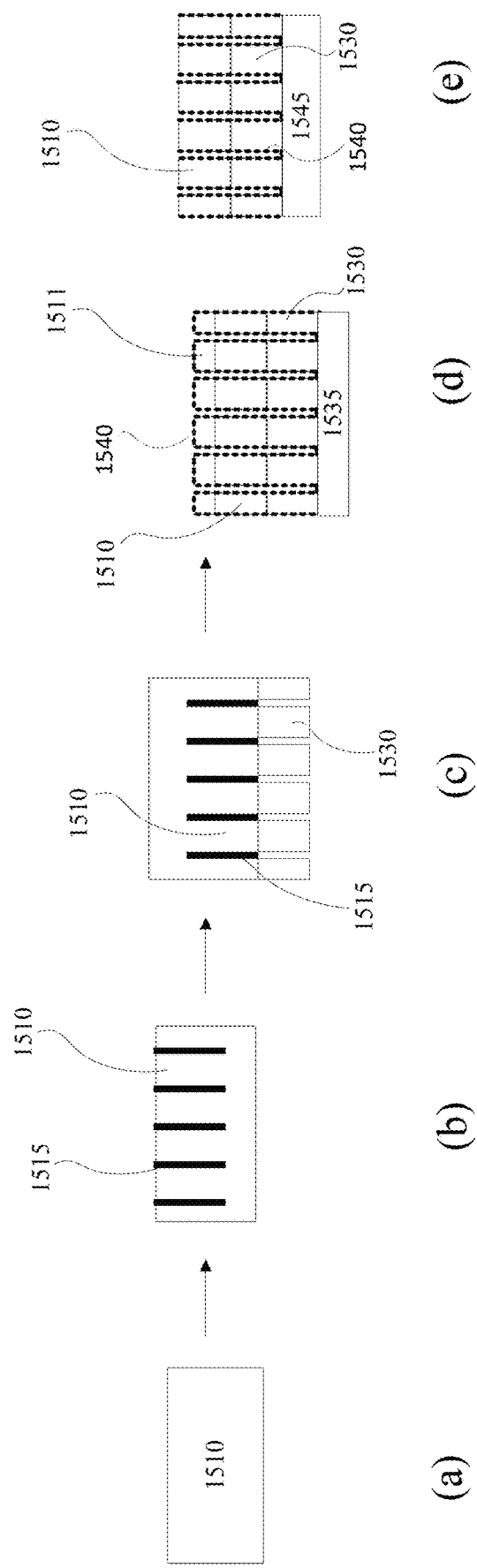
FIG. 1G is another cross-section view diagram of generating pixels in an LED array.

According to an implementation of the disclosed subject matter, as shown in FIG. 1F at step 1410 and in FIG. 1G at (b), a wavelength converting layer 1510 of FIG. 1G (a) may be partially diced to segment the wavelength converting layer 1510 into multiple segments. The dicing may result in gaps 1515 between the segments. As shown in FIG. 1G at (b), the gaps 1315 between the segments may not contain the wavelength converting layer 1510. A contiguous portion of the wavelength converting layer 1510 may remain and may connect the segments such that the dicing results in partial isolation between the multiple segments that are connected by a connecting segment of the wavelength converting layer.

According to step 1420 of FIG. 1F, as shown in FIG. 1G at (c), the segmented wavelength converting layer 1510 may be aligned with and attached to light emitting devices 1530. The gaps 1515 between the segmented wavelength converting layers may correspond to the spacing between the light emitting devices 1530 such that the segmented wavelength converting layers can be aligned with and attached to the light emitting devices 1530. Light emitting devices 1530 may contain an active light-emitting layer and may also contain n-contacts and p-contacts that enable current to activate the active light-emitting layer. The wavelength converting layer 1510 and light emitting devices 1530 may be cured via any applicable technique such as temperature based curing, polymer based curing, UV based curing, or the like.

According to step 1430 of FIG. 1F, as shown in FIG. 1G at (d), the contiguous portion of the wavelength converting layer 1510 that connected the segmented wavelength converting layers may be removed. The portion of wavelength converting layer 1510 may be removed using any applicable technique including via sawing, etching, applying a mask to dice, using one or more lasers, chemical treatment, or the like, or by dicing as understood in the art. The dicing may result in individual pixels that contain light emitting devices 1530, and wavelength converting layers 1530, such that the pixels are not connected via the wavelength converting layer 1510.

As shown in FIG. 1G at (d), the light emitting devices 1530 with the segmented wavelength converting layer 1510 (collectively, pixels) may be placed on a tape 1535 which may be configured to restrict the leakage of gas particles. As an example, the tape 1535 may be a kapton tape. According to step 1440 of FIG. 1G, an optical isolation material 1540 may be applied to the pixels. The optical isolation material may be applied via an atomic layer deposition (ALD) process. ALD is a technique whereby a material may be deposited onto a surface in a self-limiting manner such that a thin coating or layer of the material is deposited into the surface. As shown in FIG. 1G at (d), an optical isolation material 1540 may be deposited onto the exposed surfaces of the pixels including the sidewalls of the light emitting devices 1530, the sidewalls of the wavelength converting layers 1510.

As shown in FIG. 1G at (e) the pixels may be deposited onto a tape 1545 configured to support component removal techniques. According to an implementation, tape 1535 and 1545 may be the same tape. According to step 1450 of FIG. 1F, sacrificial portions 1540 of the wavelength converting layer 1510 distal from respective light emitting devices 1530 as well as the optical isolation material 1540 on the top surface and sidewalls of the sacrificial portions 1540 of the wavelength converting layer may be removed. The sacrificial portions 1540 of the wavelength converting layer may be any subset of the wavelength converting layer 1510 and may be, for example, approximately 1%, 10%, 20%, 30%, 40%, 50%, 60%, 70%, 80%, 90%, or 99% of the wavelength converting layer 1510. The removal may be conducted via sawing, etching, applying a mask to dice, using one or more lasers, chemical treatment, or the like, or dicing as understood in the art. The resulting pixel may contain light emitting devices 1530 with optical isolation material on their sidewalls and wavelength converting layers 1510 with optical isolation material on their sidewalls. As shown, the surface of the wavelength converting layers 1510 opposite the light emitting devices 1350 do not contain the optical isolation material and the pixels may be configured to emit light through this surface.

Figure 1H:
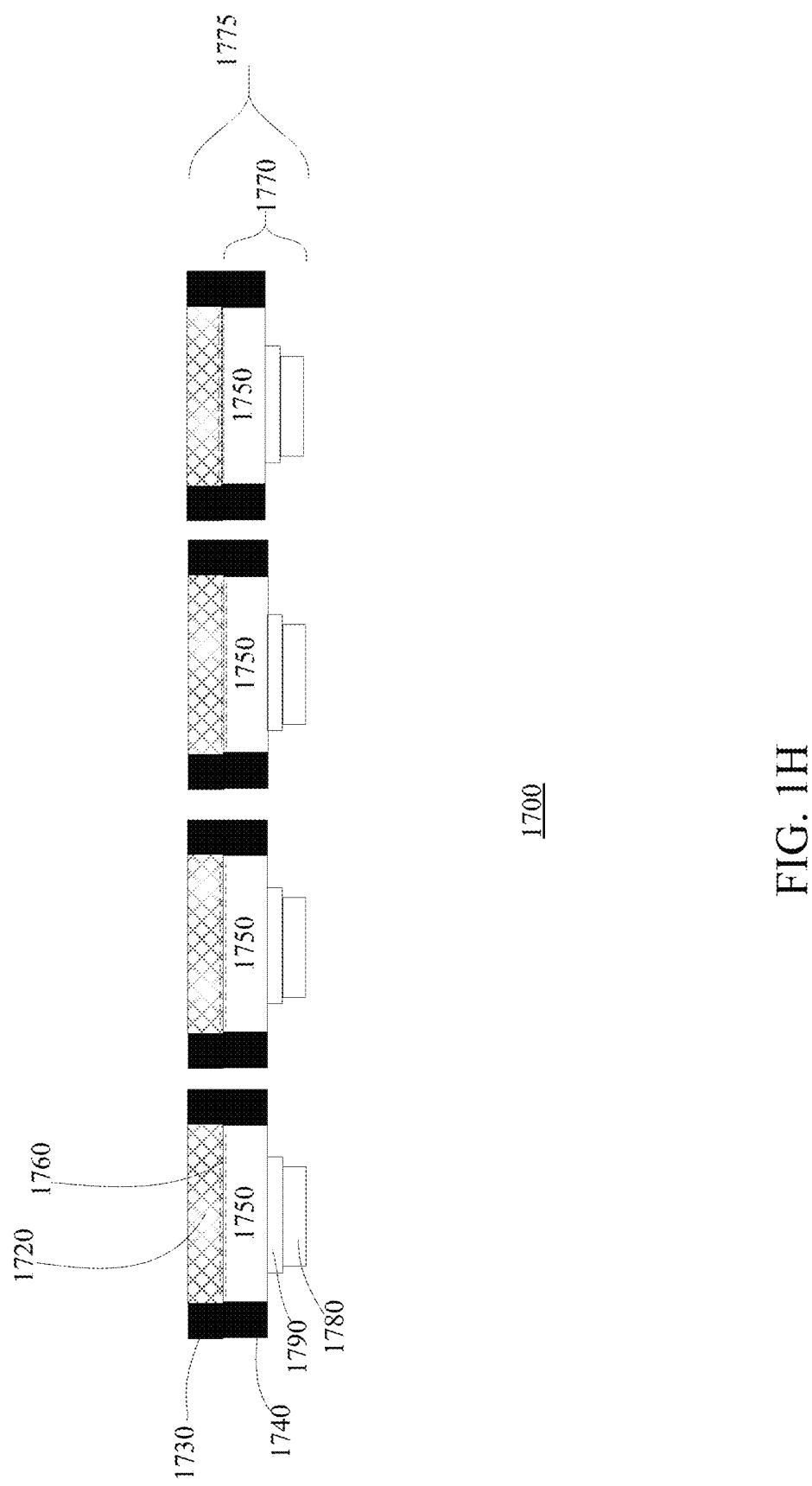
FIG. 1H is a cross-section view diagram of an LED array.

As shown in FIG. 1H, wavelength converting layers 1720 may be attached to light emitting devices 1770 of an LED array 1700, to create pixels 1775. Wavelength converting layers 1720 can be the same as or similar to wavelength converting layers 1310 of FIG. 1E and/or 1510 of FIG. 1G. Light emitting devices 1770 may be the same as or similar to the light emitting devices 1330 of FIG. 1E and/or 1530 of FIG. 1G. In FIG. 1N, light emitting devices 1770 may include GaN layer 1750, active region 1790, contact 1780, pattern sapphire substrate (PSS) 1760, and wavelength converting layers 1720. The wavelength converting layers 1720 are shown to include optical isolation material 1730 on the sidewalls of the wavelength converting layers 1720 but not on the surface distal to the light emitting devices 1770, in accordance with the disclosure herein as any optical isolation material on this distal surface may be removed along with removal of a sacrificial portion of the respective wavelength converting layer. More specifically, the spacing created between the pixels may correspond to gaps created during dicing, as disclosed in FIGS. 1D-1G.

As shown in FIG. 1H, sidewall materials 1730 may be applied to the wavelength converting layers 1720. The wavelength converting layers 1720 may be mounted over GaN layers 1750 and pattern sapphire substrate (PSS) patterns 1760 may be located between the GaN layers 1750 and the wavelength converting layers. Active regions 1790 may be configured to emit light at least partially towards the wavelength converting layers 1720 and the light emitting devices 1770 may include contacts 1780. Optical isolator material 1740 may be applied to the sidewalls of the GaN layer 1750. The expandable film 1710 may be removed from the wavelength converting layers 1720, for example, after the wavelength converting layers 1720 have been attached to the light emitting devices 1770.

As an example, the pixels 1775 of FIG. 1H may correspond to the pixels 111 of FIG. 1A-C. Specifically, as shown in FIG. 1A, the pixels 111 may correspond to the pixels 1775 of FIG. 1N after the wavelength converting layers 1720 are mounted onto the light emitting devices 1770. When the pixels 111 or 1775 are activated, the respective active regions 1790 of the emitters may generate a light. The light may pass through the wavelength converting layers 1720 and may substantially be emitted from the surface of the pixels 1775 and light that reaches the sidewalls of the wavelength converting layers 1720 may not escape from the sidewalls due to the sidewall materials 1730 and may be reflected when it intersects the sidewalls due to the sidewall materials 1730.

The pixels 1775 of FIG. 1H may be similar to the pixels 111 of FIG. 1A, and pixels 1010, 1020, and 1030 of FIG. 1B. The pixels 1775 of FIG. 1H may be part of an LED array 410 of FIG. 2A, as further disclosed herein.

Figure 2A:
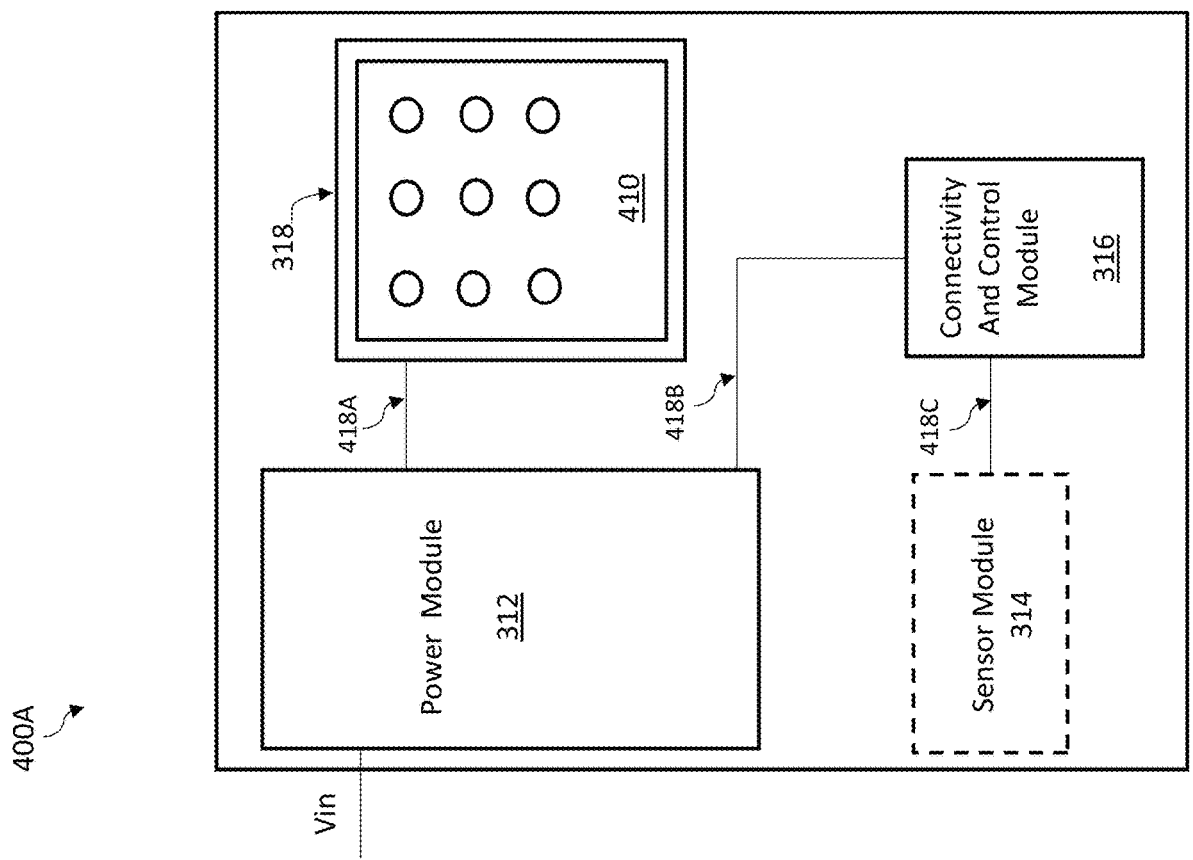
FIG. 2A is a top view of the electronics board with LED array attached to the substrate at the LED device attach region in one embodiment.

FIG. 2A is a top view of an electronics board with an LED array 410 attached to a substrate at the LED device attach region 318 in one embodiment. The electronics board together with the LED array 410 represents an LED system 400A. Additionally, the power module 312 receives a voltage input at Vin 497 and control signals from the connectivity and control module 316 over traces 418B, and provides drive signals to the LED array 410 over traces 418A. The LED array 410 is turned on and off via the drive signals from the power module 312. In the embodiment shown in FIG. 2A, the connectivity and control module 316 receives sensor signals from the sensor module 314 over trace 418C.

Figure 2B:
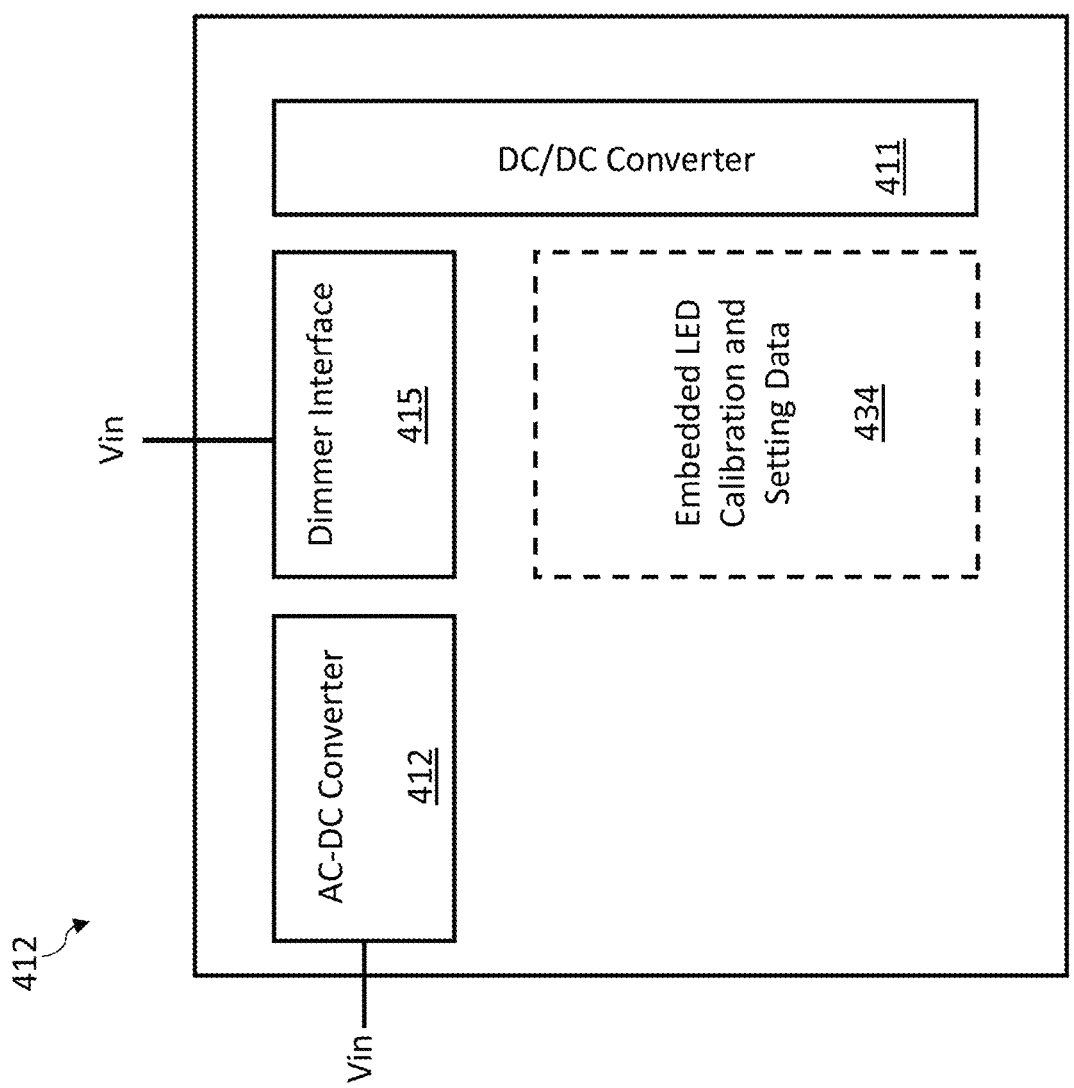
FIG. 2B is a diagram of one embodiment of a two channel integrated LED lighting system with electronic components mounted on two surfaces of a circuit board.

FIG. 2B illustrates one embodiment of a two channel integrated LED lighting system with electronic components mounted on two surfaces of a circuit board 499. As shown in FIG. 2B, an LED lighting system 400B includes a first surface 445A having inputs to receive dimmer signals and AC power signals and an AC/DC converter circuit 412 mounted on it. The LED system 400B includes a second surface 445B with the dimmer interface circuit 415, DC-DC converter circuits 440A and 440B, a connectivity and control module 416 (a wireless module in this example) having a microcontroller 472, and an LED array 410 mounted on it. The LED array 410 is driven by two independent channels 411A and 411B. In alternative embodiments, a single channel may be used to provide the drive signals to an LED array, or any number of multiple channels may be used to provide the drive signals to an LED array.

The LED array 410 may include two groups of LED devices. In an example embodiment, the LED devices of group A are electrically coupled to a first channel 411A and the LED devices of group B are electrically coupled to a second channel 411B. Each of the two DC-DC converters 440A and 440B may provide a respective drive current via single channels 411A and 411B, respectively, for driving a respective group of LEDs A and B in the LED array 410. The LEDs in one of the groups of LEDs may be configured to emit light having a different color point than the LEDs in the second group of LEDs. Control of the composite color point of light emitted by the LED array 410 may be tuned within a range by controlling the current and/or duty cycle applied by the individual DC/DC converter circuits 440A and 440B via a single channel 411A and 411B, respectively. Although the embodiment shown in FIG. 2B does not include a sensor module (as described in FIG. 2A), an alternative embodiment may include a sensor module.

The illustrated LED lighting system 400B is an integrated system in which the LED array 410 and the circuitry for operating the LED array 410 are provided on a single electronics board. Connections between modules on the same surface of the circuit board 499 may be electrically coupled for exchanging, for example, voltages, currents, and control signals between modules, by surface or sub-surface interconnections, such as traces 431, 432, 433, 434 and 435 or metallizations (not shown). Connections between modules on opposite surfaces of the circuit board 499 may be electrically coupled by through board interconnections, such as vias and metallizations (not shown).

According to embodiments, LED systems may be provided where an LED array is on a separate electronics board from the driver and control circuitry. According to other embodiments, a LED system may have the LED array together with some of the electronics on an electronics board separate from the driver circuit. For example, an LED system may include a power conversion module and an LED module located on a separate electronics board than the LED arrays.

According to embodiments, an LED system may include a multi-channel LED driver circuit. For example, an LED module may include embedded LED calibration and setting data and, for example, three groups of LEDs. One of ordinary skill in the art will recognize that any number of groups of LEDs may be used consistent with one or more applications. Individual LEDs within each group may be arranged in series or in parallel and the light having different color points may be provided. For example, warm white light may be provided by a first group of LEDs, a cool white light may be provided by a second group of LEDs, and a neutral white light may be provided by a third group.

Figure 2C:
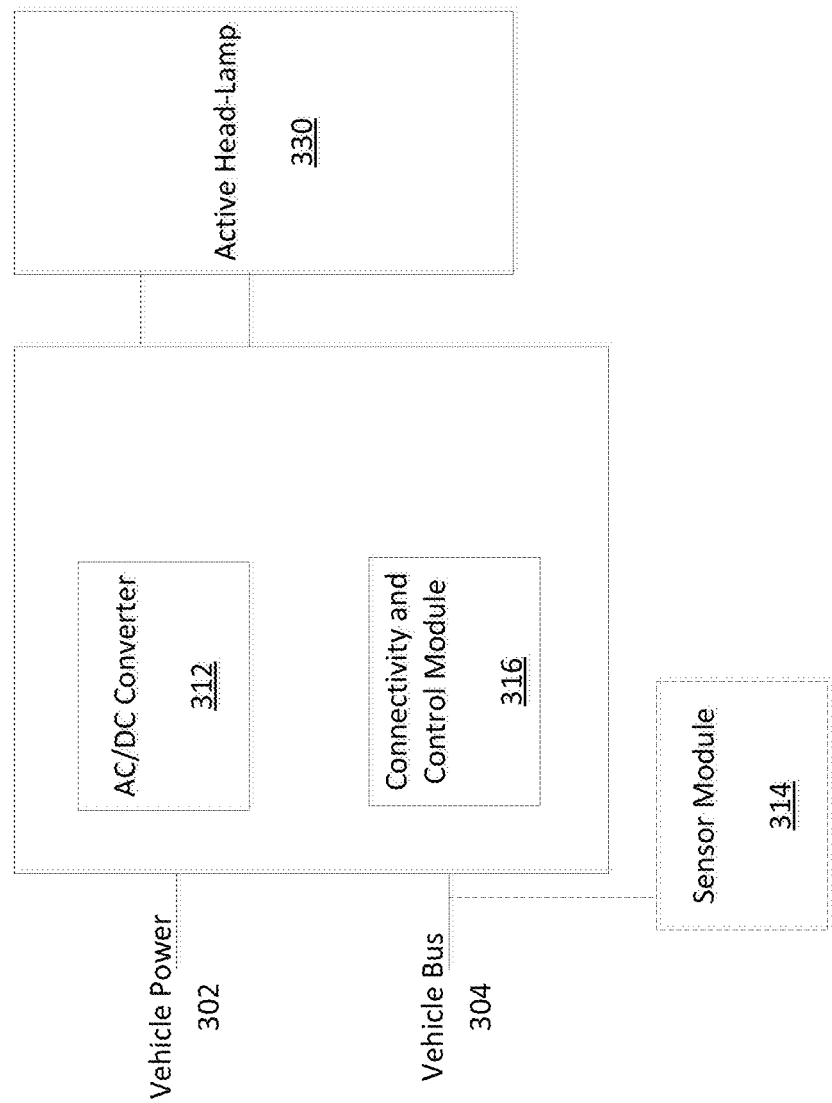
FIG. 2C is an example vehicle headlamp system.

FIG. 2C shows an example vehicle headlamp system 300 including a vehicle power 302 including a data bus 304. A sensor module 307 may be connected to the data bus 304 to provide data related to environment conditions (e.g. ambient light conditions, temperature, time, rain, fog, etc), vehicle condition (parked, in-motion, speed, direction), presence/position of other vehicles, pedestrians, objects, or the like. The sensor module 307 may be similar to or the same as the sensor module 314 of FIG. 2A. AC/DC Converter 305 may be connected to the vehicle power 302.

The AC/DC converter 312 of FIG. 2C may be the same as or similar to the AC/DC converter 412 of FIG. 2B and may receive AC power from the vehicle power 302. It may convert the AC power to DC power as described in FIG. 2B for AC-DC converter 412. The vehicle head lamp system 300 may include an active head lamp 330 which receives one or more inputs provided by or based on the AC/DC converter 305, connectivity and control module 306, and/or sensor module 307. As an example, the sensor module 307 may detect the presence of a pedestrian such that the pedestrian is not well lit, which may reduce the likelihood that a driver sees the pedestrian. Based on such sensor input, the connectivity and control module 306 may output data to the active head lamp 330 using power provided from the AC/DC converter 305 such that the output data activates a subset of LEDs in an LED array contained within active head lamp 330. The subset of LEDs in the LED array, when activated, may emit light in the direction where the sensor module 307 sensed the presence of the pedestrian. These subset of LEDs may be deactivated or their light beam direction may otherwise be modified after the sensor module 207 provides updated data confirming that the pedestrian is no longer in a path of the vehicle that includes vehicle head lamp system.

Figure 3:
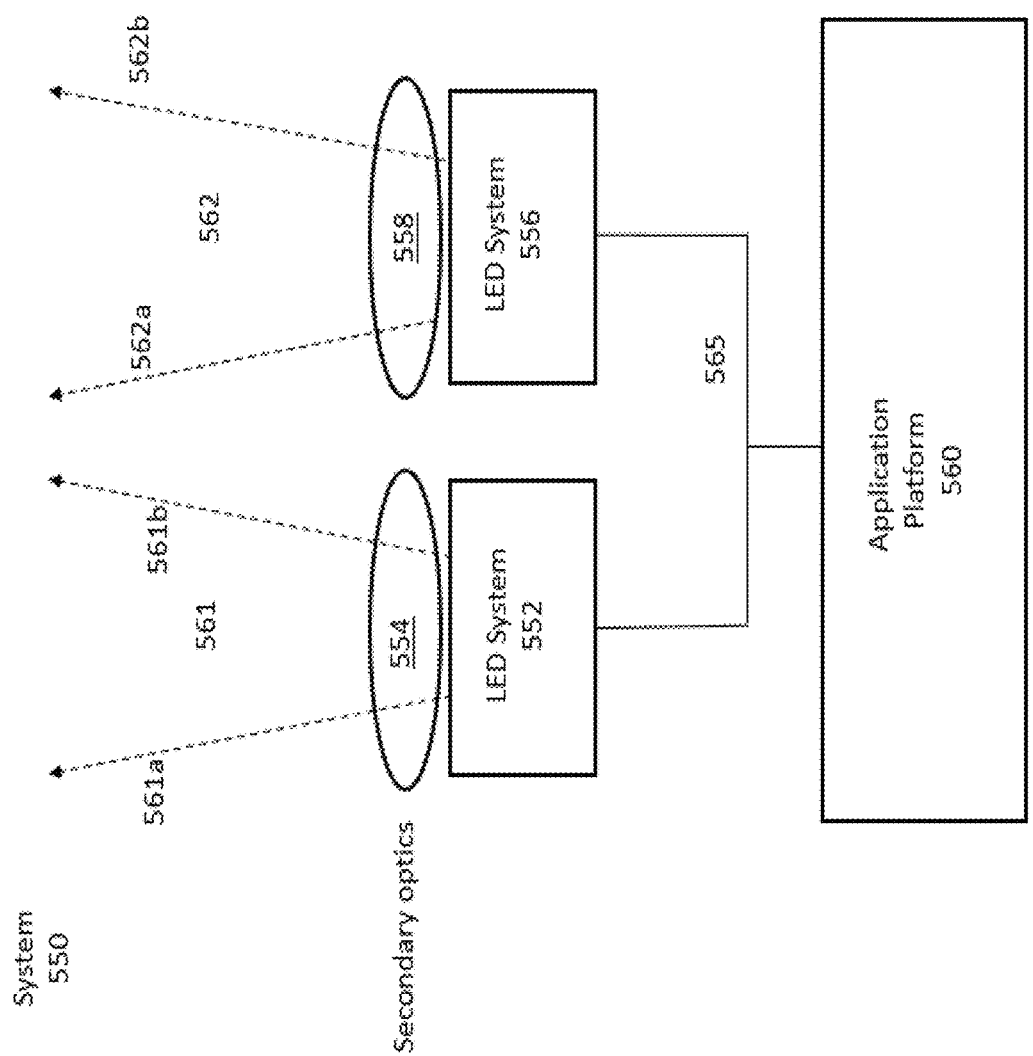
FIG. 3 shows an example illumination system.

FIG. 3 shows an example system 550 which includes an application platform 560, LED systems 552 and 556, and optics 554 and 558. The LED System 552 produces light beams 561 shown between arrows 561a and 561b. The LED System 556 may produce light beams 562 between arrows 562a and 562b. In the embodiment shown in FIG. 3, the light emitted from LED System 552 passes through secondary optics 554, and the light emitted from the LED System 556 passes through secondary optics 558. In alternative embodiments, the light beams 561 and 562 do not pass through any secondary optics. The secondary optics may be or may include one or more light guides. The one or more light guides may be edge lit or may have an interior opening that defines an interior edge of the light guide. LED systems 552 and/or 556 may be inserted in the interior openings of the one or more light guides such that they inject light into the interior edge (interior opening light guide) or exterior edge (edge lit light guide) of the one or more light guides. LEDs in LED systems 552 and/or 556 may be arranged around the circumference of a base that is part of the light guide. According to an implementation, the base may be thermally conductive. According to an implementation, the base may be coupled to a heat-dissipating element that is disposed over the light guide. The heat-dissipating element may be arranged to receive heat generated by the LEDs via the thermally conductive base and dissipate the received heat. The one or more light guides may allow light emitted by LED systems 552 and 556 to be shaped in a desired manner such as, for example, with a gradient, a chamfered distribution, a narrow distribution, a wide distribution, an angular distribution, or the like.

In example embodiments, the system 550 may be a mobile phone of a camera flash system, indoor residential or commercial lighting, outdoor light such as street lighting, an automobile, a medical device, AR/VR devices, and robotic devices. The LED System 400A shown in FIG. 2A and vehicle head lamp system 300 shown in FIG. 2C illustrate LED systems 552 and 556 in example embodiments.

The application platform 560 may provide power to the LED systems 552 and/or 556 via a power bus via line 565 or other applicable input, as discussed herein. Further, application platform 560 may provide input signals via line 565 for the operation of the LED system 552 and LED system 556, which input may be based on a user input/preference, a sensed reading, a pre-programmed or autonomously determined output, or the like. One or more sensors may be internal or external to the housing of the application platform 560. Alternatively or in addition, as shown in the LED system 400 of FIG. 2A, each LED System 552 and 556 may include its own sensor module, connectivity and control module, power module, and/or LED devices.

In embodiments, application platform 560 sensors and/or LED system 552 and/or 556 sensors may collect data such as visual data (e.g., LIDAR data, IR data, data collected via a camera, etc.), audio data, distance based data, movement data, environmental data, or the like or a combination thereof. The data may be related a physical item or entity such as an object, an individual, a vehicle, etc. For example, sensing equipment may collect object proximity data for an ADAS/AV based application, which may prioritize the detection and subsequent action based on the detection of a physical item or entity. The data may be collected based on emitting an optical signal by, for example, LED system 552 and/or 556, such as an IR signal and collecting data based on the emitted optical signal. The data may be collected by a different component than the component that emits the optical signal for the data collection. Continuing the example, sensing equipment may be located on an automobile and may emit a beam using a vertical-cavity surface-emitting laser (VCSEL). The one or more sensors may sense a response to the emitted beam or any other applicable input.

In example embodiment, application platform 560 may represent an automobile and LED system 552 and LED system 556 may represent automobile headlights. In various embodiments, the system 550 may represent an automobile with steerable light beams where LEDs may be selectively activated to provide steerable light. For example, an array of LEDs may be used to define or project a shape or pattern or illuminate only selected sections of a roadway. In an example embodiment, Infrared cameras or detector pixels within LED systems 552 and/or 556 may be sensors (e.g., similar to sensors module 314 of FIG. 2A and 307 of FIG. 2C) that identify portions of a scene (roadway, pedestrian crossing, etc.) that require illumination.

Having described the embodiments in detail, those skilled in the art will appreciate that, given the present description, modifications may be made to the embodiments described herein without departing from the spirit of the inventive concept. Therefore, it is not intended that the scope of the invention be limited to the specific embodiments illustrated and described. Although features and elements are described above in particular combinations, one of ordinary skill in the art will appreciate that each feature or element can be used alone or in any combination with the other features and elements. In addition, the methods described herein may be implemented in a computer program, software, or firmware incorporated in a computer-readable medium for execution by a computer or processor. Examples of computer-readable media include electronic signals (transmitted over wired or wireless connections) and computer-readable storage media. Examples of computer-readable storage media include, but are not limited to, a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

The invention claimed is:

1. A method for making a pixelated array of wavelength converted light emitting devices, the method comprising:
providing a wavelength converting structure comprising a wavelength converting layer having a first surface and a carrier layer having a first surface and an oppositely positioned second surface, the first surface of the wavelength converting layer disposed on the first surface of the carrier layer, the wavelength converting structure comprising gaps extending completely through the wavelength converting layer and partially through the carrier layer perpendicular to the first surface of the carrier layer to define at least a first segment of the wavelength converting structure having a first structure surface opposite from the first surface of the carrier layer and a second segment of the wavelength converting structure having a second segment surface opposite from the first surface of the carrier layer;
after providing the wavelength converting structure, attaching a first light emitting device to the first segment surface of the first segment and attaching a second light emitting device to the second segment surface of the second segment;
removing a portion of the carrier layer starting from the second surface of the carrier layer to open ends of the gaps to define at least a first pixel from the first segment and the first light emitting device and a second pixel from the second segment and the second light emitting device;
disposing an optical isolation material on exposed surfaces of each of the first pixel and the second pixel; and
removing remaining portions of the carrier layers from the first pixel and the second pixel along with portions of the optical isolation material disposed on the remaining portions of the carrier layer.

2. The method of claim 1, wherein providing the wavelength converting structure comprises dicing the wavelength converting layer and the carrier layer to form the gaps.

3. The method of claim 2, wherein providing the wavelength converting structure further comprises attaching the wavelength converting layer to the carrier layer before dicing the wavelength converting layer and the carrier layer.

4. The method of claim 1, further comprising curing the first pixel and the second pixel before removing the portion of the carrier layer.

5. The method of claim 1, further comprising transferring the first pixel and the second pixel onto at least one of a kapton tape or a grinding tape before disposing the optical isolation material.

6. The method of claim 1, wherein the wavelength converting layer is selected from a phosphor in glass, a phosphor in silicone, and a phosphor ceramic.

7. The method of claim 1, wherein the optical isolation material is selected from a distributed Bragg reflector (DBR), a reflective material, and an absorptive material.

8. The method of claim 1, wherein a coefficient of thermal expansion (CTE) of the carrier layer is substantially matched to a CTE of the wavelength converting layer.

9. The method of claim 1, wherein the optical isolation material is disposed using an atomic layer deposition (ALD) technique.

10. The method of claim 1, wherein the first pixel is less than 500 microns wide.

* * * * *